(12) United States Patent
Nering

(10) Patent No.: US 6,448,537 B1
(45) Date of Patent: Sep. 10, 2002

(54) SINGLE-WAFER PROCESS CHAMBER THERMAL CONVECTION PROCESSES

(76) Inventor: Eric Anton Nering, 310 Nebraska Ave., Modesto, CA (US) 95358

( * ) Notice: Subject to any disclaimer, the term of this patent is extended or adjusted under 35 U.S.C. 154(b) by 0 days.

(21) Appl. No.: 10/013,965

(22) Filed: Dec. 10, 2001

Related U.S. Application Data

(60) Provisional application No. 60/254,755, filed on Dec. 11, 2000.

(51) Int. Cl.$^7$ .................................................. F27B 5/04
(52) U.S. Cl. ........................ 219/390; 219/400; 219/405; 219/411; 118/724; 118/50.1; 118/725
(58) Field of Search ................................ 219/390, 405, 219/400, 411; 118/724, 725, 50.1; 392/416, 418

(56) References Cited

U.S. PATENT DOCUMENTS

| | | | | |
|---|---|---|---|---|
| 4,625,678 A | * | 12/1986 | Shioya et al. | 118/723 |
| 4,792,378 A | * | 12/1988 | Rose et al. | 118/728 |
| 5,226,056 A | * | 7/1993 | Kikuchi et al. | 373/18 |
| 5,244,501 A | * | 9/1993 | Nakayama et al. | 118/725 |
| 5,948,168 A | * | 9/1999 | Shan et al. | 118/723 R |
| 6,262,397 B1 | * | 7/2001 | Yazawa | 219/411 |
| 6,332,927 B1 | * | 12/2001 | Inokuchi et al. | 118/725 |

* cited by examiner

Primary Examiner—Teresa Walberg
Assistant Examiner—Shawntina T. Fuqua
(74) Attorney, Agent, or Firm—William Michael Hynes; Townsend and Townsend and Crew, LLP

(57) ABSTRACT

A thermal processing chamber configured to enclose and heat treat a single electronic substrate at an exposed surface, such as a wafer or electronic circuit board being re-melted, includes an enclosed gas tight and particle free heat insulated chamber. An electronic substrate support is placed within the enclosed gas tight and particle free heat insulated chamber. A convection gas inlet distribution manifold adjustable in spatial relation towards and away from the surface to be treated provides a flow of heated gas over and onto the exposed surface of the electronic substrate to be treated. A heated convection gas outlet is placed below the electronic substrate for the collection of heated gas after flowing over, around and below the exposed surface of the electronic substrate to be treated. A door is movable between and open and closed position. The door opens a path to move the electronic substrate into and out of the chamber to and from the electronic substrate support in an open position. The door has a gas-tight seal with respect to the chamber when in the closed position. A heater having an inlet for receiving gas, and an outlet for discharging heated gas provides heated gas for the convection treatment. A heat exchanger receives gas from the convention gas outlet and discharges gas to the heater inlet to enable heat recovery from the gas discharged from the convention gas outlet and to simultaneously enable precise temperature control. Provision is made for disposing individual ovens in juxtaposition to enable multiple substrates to be processed simultaneously.

17 Claims, 4 Drawing Sheets

SINGLE-WAFER PROCESS CHAMBER THERMAL CONVECTION PROCESSES

CROSS-REFERENCES TO RELATED APPLICATIONS

This application references U.S. Provisional Patent Application No. 60/254,755, filed Dec. 11, 2000 by the named inventor herein entitled SINGLE-WAFER PROCESS CHAMBER THERMAL CONVECTION PROCESSES and is herein incorporated by reference as is fully set forth herein with the subject of the present invention being independently patentable over all.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

The present invention generally relates to apparatuses used to affect a thermal process on semiconductor (silicon) wafers by heating the wafer via convection heating. The wafers are subjected to a programmed temperature profile. The heat transfer mechanism is convection heat transfer via a heated gas, which may be air, nitrogen, or any specific transfer gas suited to the intended process.

BACKGROUND OF THE INVENTION

Semiconductor wafer fabrication requires thermal process steps where the wafer is heated to specific temperatures and maintained at said temperatures for specific times. Typical processes require a series of successive temperatures to be achieved for specific time intervals.

Additionally, circuit boards require so-called re-melting of solder to finish connection of placed components to conductive channels (solder pads) on the circuit boards. In such remelting, precise temperature control is paramount. Temperature must be sufficient to permit the re-melting without component damage due to undue heating.

The specific process step and temperature to be attained determines which heat transfer method is best suited. In what follows, I will concentrate on wafer treatment. The reader will understand that circuit board treatment is also a use for the technology disclosed here.

Conventional (existing) wafer convection thermal processes are based on either batch or in-line configurations. This invention provides an alternate means for processing wafers, one-at-a-time, in a process chamber that provides better uniformity in heating and more flexibility in process conditions than can be achieved in either the batch or in-line processes.

In the batch process, a number of wafers are held in a process chamber, and subjected to flow of heated transfer gas. Because each wafer is not subjected to exactly the same environment, the process results and conditions vary from wafer to wafer. The temperature profile is achieved by varying the temperature of the convection gas stream.

In the in-line configuration, wafers are placed either directly on a conveyor or on a carrier attached to the conveyor designed to hold wafers. The conveyor moves the wafers through a sequence of temperature zones, each which is held at a fixed temperature. The temperature profile is achieved by passing the wafer through a sequence of oven zones, each being at a temperature step required in the process. Each wafer sees thermal stresses to the leading edge transitioning to a new temperature zone while the trailing edge of the wafer is still at the previous zone temperature.

I am unaware of convection heating being utilized to treat single wafers.

SUMMARY OF THE INVENTION

A thermal processing chamber configured to enclose and heat treat a single electronic substrate at an exposed surface, such as a wafer or electronic circuit board being re-melted, includes an enclosed gas tight and particle free heat insulated chamber. An electronic substrate support is placed within the enclosed gas tight and particle free heat insulated chamber. A convection gas inlet distribution manifold adjustable in spatial relation towards and away from the surface to be treated provides a flow of heated gas over and onto the exposed surface of the electronic substrate to be treated. A heated convection gas outlet is placed below the electronic substrate for the collection of heated gas after flowing over, around and below the exposed surface of the electronic substrate to be treated. A door is movable between and open and closed position. The door opens a path to move the electronic substrate into and out of the chamber to and from the electronic substrate support in an open position. The door has a gas-tight seal with respect to the chamber when in the closed position. A heater having an inlet for receiving gas, and an outlet for discharging heated gas provides heated gas for the convection treatment. A heat exchanger receives gas from the convection gas outlet and discharges gas to the heater inlet to enable heat recovery from the gas discharged from the convention gas outlet and to simultaneously enable precise temperature control. Provision is made for disposing individual ovens in juxtaposition to enable multiple substrates to be processed simultaneously.

This invention applies to wafer and circuit board processes where heating by convection is the primary heat transfer means, although some small percentage of the heat transfer may be via radiation or conduction.

The present invention provides a practical means to achieve single-wafer thermal convection processing with high process uniformity for a wide variety of process types, while achieving high through-put normally not achievable in a single-wafer processing configurations. Also, the form of the invention is well suited to utilize conventional wafer handling means such as 3-axis SCARA type robots with both vacuum and edge-grip end-effectors. By using standard wafer handling components, costs are reduced, reliability is improved, and contamination effects are lowered when compared to other handling means.

The invention consists of a single-wafer process chamber design, which is modular in nature, enabling clustering of multiple process chambers in both vertical and radial arrangements. The modular nature of the process chamber greatly simplifies connections to the transfer gas inlets and outlets, as well as power connections for heaters and control connections. Also important, its size allows for the close proximity of chambers, allowing a single robot to access multiple chambers from a single fixed robot location. In this clustered configuration, multiple single-wafer chambers can be run in parallel, thereby achieving throughput equal to or greater than batch or in-line processes.

Also significant, the small size and flexible wafer handling allows the thermal process system to be closely coupled to the upstream wafer process system which applies the coating which drives the need for the subsequent thermal process step. This enables a closely controlled time interval from the time when the coating is first applied to when the coating is cured, fixed, or re-flowed. Also significant is that with application and cure (or bake, or re-flow) combined, the wafers enter and leave the over-all system is a stable state, with no time dependencies or special handling required.

The modular process chamber has a side-opening door for placement of the wafer by an external robot, and lift pins or edge supports to hold the wafer in place. The process chamber is thermally insulated, and has an entry gas manifold in the chamber top, and an exit gas manifold in the chamber bottom. The design of the gas manifolds for the inlet gas flow is very important to direct the gas flow onto the wafer surface to achieve the uniformity required. The exit gas manifold design is equally important so the exiting gas is uniformly distributed about the chamber bottom and the backside of the wafer.

To achieve the desired temperature control, a controller measures the exit gas temperature, and heat input is adjusted to the inlet gas stream. Also, the fan speed is variable, allowing for the optimum gas flow velocity to be achieved for each stage of the wafer recipe profile. Higher flows are used to ramp temperatures, and lower flows to maintain a fixed temperature. The showerhead distance from the wafer is adjustable, as well as the sizes and locations of the individual holes (nozzles).

The major benefits that this invention brings to this technology area is that each wafer sees exactly the same process conditions ensuring good uniformity between wafers. The single wafer chamber design also allows many parameters to be adjusted to match the process requirements for each wafer: the convection gas flow velocity, distribution path, and distance from wafer face of the incoming heated gas showerhead; this assures uniformity on a single wafer. This level of tuning to each wafer is not possible with existing thermal convection systems such as batch and in-line systems. Also, each wafer can see a unique recipe compared to all other wafers; in existing batch and conveyor systems all of the wafers must have the same recipe. The fact that each wafer can have a unique recipe speeds development time when a great number of recipe parameters must be varied in an effort to fine tune a process recipe.

The invention includes features which make it energy efficient: The heat exchanger for reheat of the incoming gas recovers 50% of the thermal input energy. The variable speed fan allows for minimal airflow and energy input whenever steady-state conditions are required.

The invention allows for advantages in uniformity for all thermal processes. In addition, the single-wafer nature of the invention offers significant advantages to process steps where a previous process step applied a substance to the wafer surface, which then must be dried, stabilized, or re-flowed within a specific time limit.

DESCRIPTION OF THE SPECIFIC EMBODIMENTS

Figure 1:
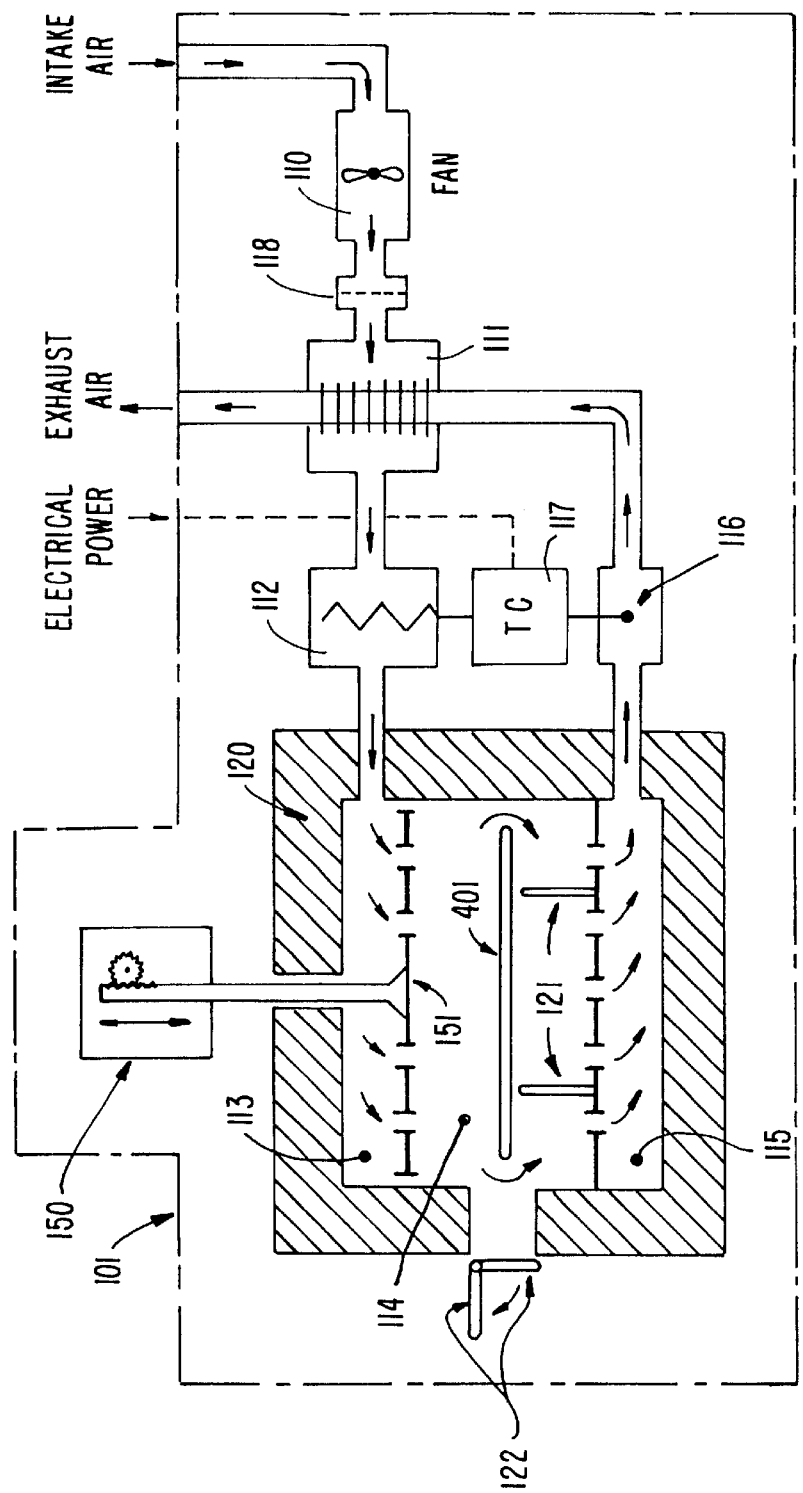
FIG. 1 is a flow-diagram schematic, which shows all significant components and their relationships for a single thermal convection process module.

FIG. 1 is a pictorial flow diagram of a single-wafer convection thermal process chamber as claimed in the invention. Some aspects of this figure are purely schematic in nature, while others express approximate physical scaling and relationships.

Process module 101 includes the chamber and all of its support ancillaries. The process chamber 120 is an insulated box with internal and external skins with insulation filling the void between the skins. The internal volume of the process chamber consists of three zones, inlet distribution plenum 113, working process volume 114 that contains the wafer, and exit collection plenum 115. Inside the process chamber volume 114 are located support pins 121 which are designed to hold the wafer 401. Alternately, edge support pockets or rails can be utilized. An inlet door 122 is provided to seal the chamber when the thermal convection process is active. The door 122 must be open for the external robot to load or unload a wafer.

The inlet plenum 113 has a plenum showerhead 151 which is adjustable in distance from the wafer; this is achieved via actuator 150 which can move the plenum showerhead in a linear fashion closer or further from the wafers top surface in a continuous range of locations.

The heated convection gas flow path is made up of the following elements: A variable speed fan 110 draws the working convection gas (air or other gas) and forces the gas first through the filter 118 and then through the heat exchanger 111. The heat exchanger 111 brings the entry and exit gas streams into close contact thereby causing a conducted heat transfer to occur. Approximately 50% of the thermal energy is recovered by this means. The gas then flows through a heater, and then into the inlet distribution plenum 113. The heated gas then flows through a series of precisely sized and located flow nozzles into the main process volume 114. The location and size of the inlet nozzles and distance above the wafer are critical for uniform heating of the wafer 401.

The gas exits via the exit gas plenum 115, which has collection nozzles precisely located for uniform gas flow in the bottom part of the chamber. After exiting the chamber, the gas temperature is monitored via a temperature sensor 116. A temperature controller 117 to maintain the desired process temperature within the process chamber 114 then uses the measurement signal from 116. The temperature controller 117 can be remotely programmed to execute a profile of temperature settings by changing the set point to match the desired working surface temperatures on the wafer.

Figure 2:
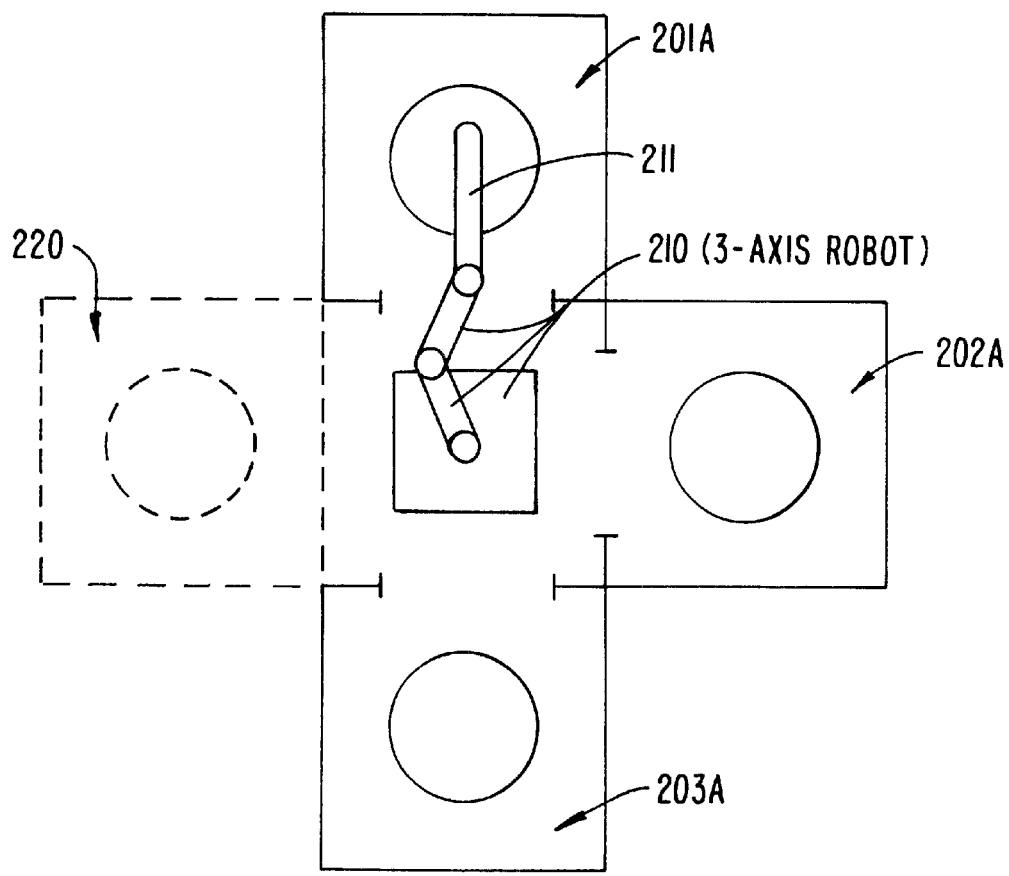
FIG. 2 is a plan view diagram of a clustered arrangement of individual chambers to form a thermal processing system.

FIG. 2 is a plan view showing a possible configuration of a cluster of process chambers 201A, 202A, and 203A. A central fixed robot 210 can reach wafers from each chamber and also a wafer loading or transfer station 220. The wafer transfer station could be a pass-through cassette, removable cassette, SMIF port, or FOUP port for 300 mm wafers.

(SMIF stands for Standard Mechanical Interface Factory and refers to a standard carrier system for 150 and 200 mm wafers, FOUP stands for Front Opening Unified Pod and refers to a standard carrier system for 300 mm wafers)

Figure 3:
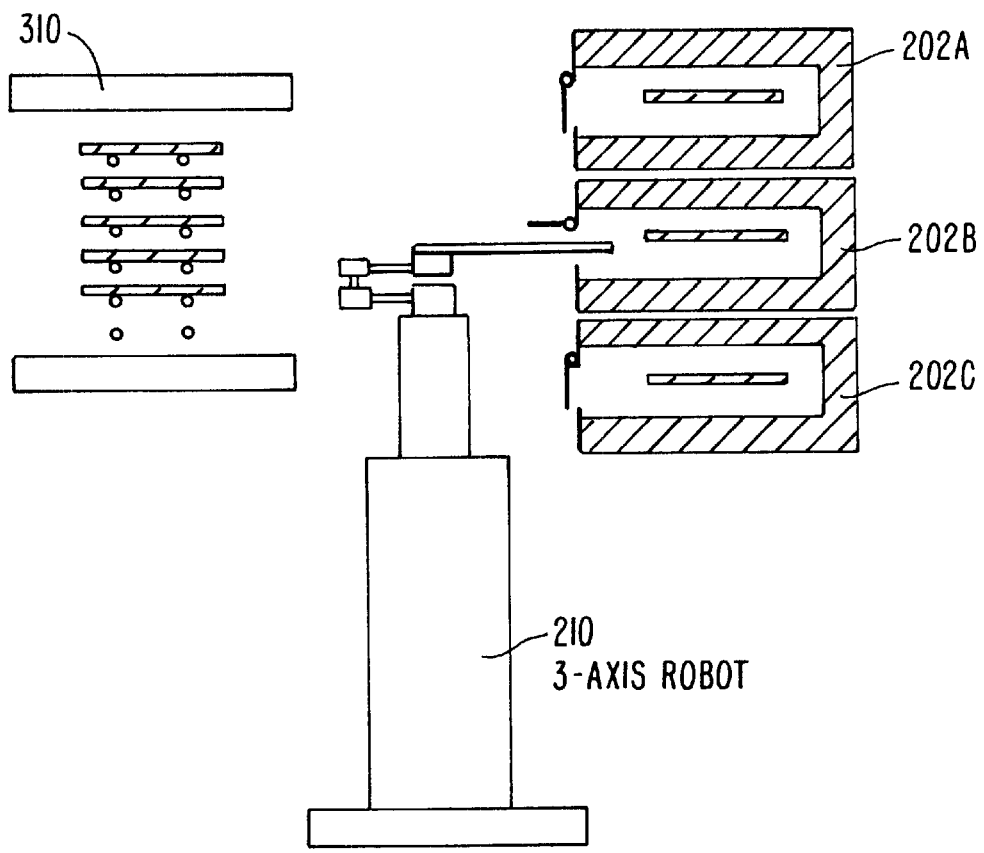
FIG. 3 is an elevation view of the same clustered arrangement as in FIG. 2, showing the vertical relationship between devices.

FIG. 3 is an elevation view showing a possible configuration of stacked process chambers 202A, 202B, and 202C. The centrally located 3-axis robot can access all process chambers as well as all slots in a pass-thru cassette or other load-station design.

If you stack 3 chambers vertically as shown in FIG. 3 and also locate 3 stacks radially as shown in FIG. 2, then a total of 9 process chambers are feasible within a single machine. Alternate arrangements can be used for more or fewer chambers. The number of chambers to be included is determined by the required through-put and the recipe time required for each wafer.

Figure 4:
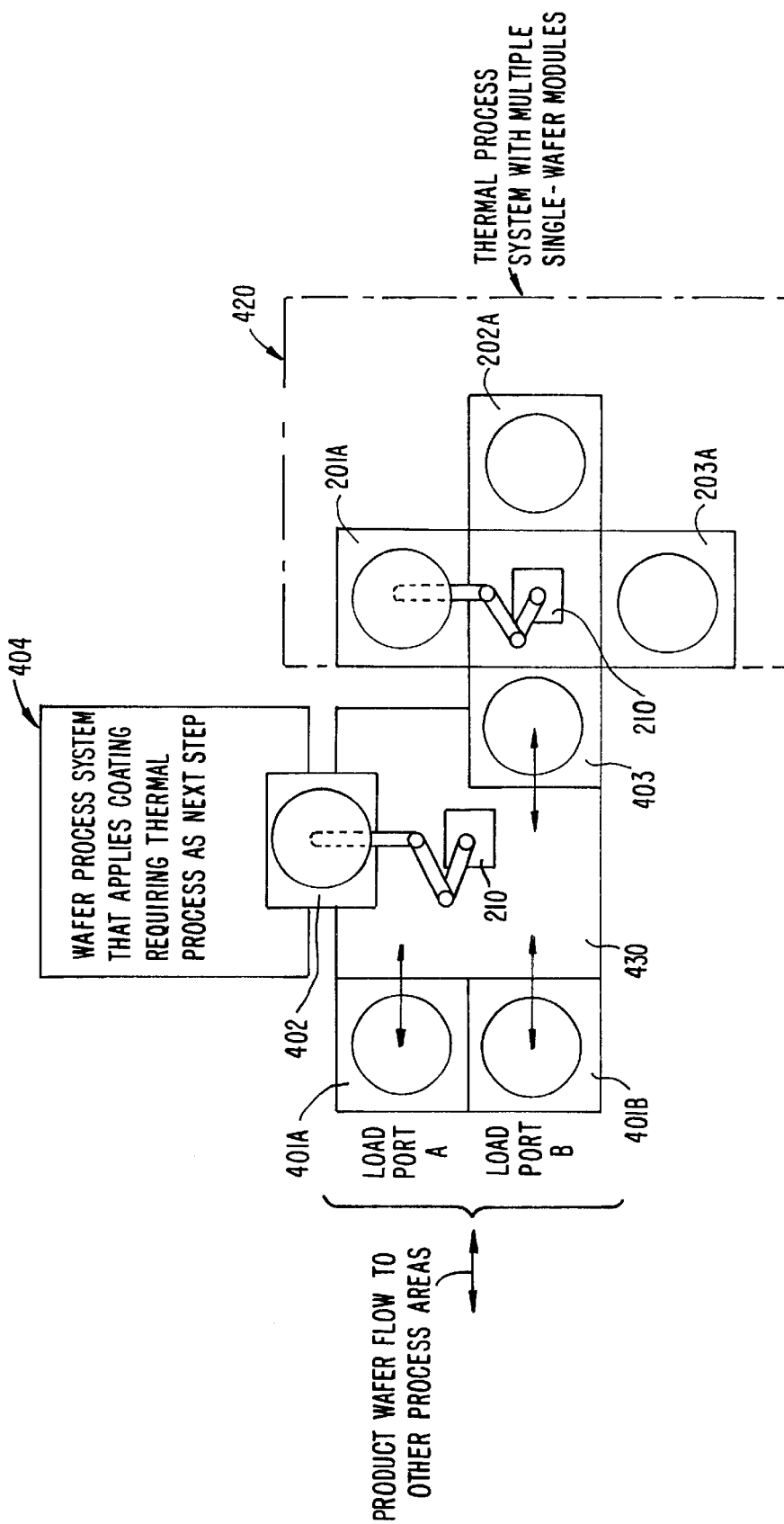
FIG. 4 is a system plan view of a higher level of integration with an upstream process tool, which has a time dependency on the thermal process step, which is next in line.

FIG. 4 is a plan view of a higher level of integration which couples a complete thermal process system to another wafer process system which applies a coating which requires a subsequent thermal process step. The complete convection thermal process system 420 is coupled to a wafer loader system 430. The basic function of the wafer loader system 430 is to remove individual wafers from load ports 401a and 401b and load them into the process tool 404, which is a coating or printing tool. After the wafers are coated or printed, they are presented in the transfer station 403, where they are then accessible by the robot of the thermal process system. After the thermal wafer recipe is completed in the thermal process system, the wafer is returned to the transfer station 403, and then returned to the load port.

The reader will understand that I have concentrated on wafers. It will be understood that this invention can be applied to circuit boards, especially in so far as re-melting is utilized to fasten components placed on such boards. In such placement, it may well be desirable to add thermal shields over the individual components being soldered to the circuit board so that the heat of convection is confined to the area of solder pads only on the circuit board.

What is claimed is:

1. A thermal processing chamber configured to enclose and heat treat an electronic substrate at an exposed surface comprising:
    an enclosed gas tight and particle free heat insulated chamber;
    an electronic substrate support within the enclosed gas tight and particle free heat insulated chamber;
    a convection gas inlet distribution manifold to provide a flow of heated gas over and onto the exposed surface of the electronic substrate to be treated;
    a heated convection gas outlet below the electronic substrate for the collection of heated gas after flowing over, around and below the exposed surface of the electronic substrate to be treated;
    a door movable between and open and closed position to provide a path to move the electronic substrate into and out of the chamber to and from the electronic substrate support in an open position, the door having a gas-tight seal with respect to the chamber when in the closed position;
    a heater having an inlet for receiving gas, and an outlet for discharging heated gas; and,
    a heat exchanger for receiving gas from the convection gas outlet and discharging gas to the heater inlet to enable heat within gas discharged from the convention gas outlet to be recovered to gas provided to the heater inlet.

2. The thermal processing chamber according to claim 1 and wherein:
    a electronic substrate conveying actuator opens and closes said door.

3. The thermal processing chamber according to claim 1 and wherein:
    convection gas inlet distribution manifold includes nozzles above the wafer adjustable towards and way from the exposed surface of the electronic substrate.

4. The thermal processing chamber according to claim 1 and wherein:
    the enclosed gas tight and particle free heat insulated chamber includes an inner chamber.

5. The thermal processing chamber according to claim 1 and wherein:
    the electronic substrate support within the enclosed gas tight and particle free heat insulated chamber includes individual support members for supporting the electronic substrate.

6. The thermal processing chamber according to claim 1 wherein a closely coupled to a heater section coupled to the gas inlet, and a temperature measurement sensor coupled to the convection gas outlet.

7. A thermal processing chamber configured to enclose and support a single semiconductor wafer comprising:
    a wafer support means (pins or edge support);
    a heated convection gas inlet distribution plenum with nozzles above the wafer that is adjustable in distance above the wafer and with a nozzle pattern that is varied according to the desired process and wafer size and type;
    a heated convection gas outlet collection plenum with collection holes below the wafer;
    an inner chamber lining that is gas tight and particle free;
    a thermal insulation system surrounding the inner chamber lining;
    an external skin and structure system to protect the insulation system and provide structural support for the chamber and related ancillaries; and,
    an actuator operated door to provide a path to move a wafer in and out of the chamber and provide a gas-tight seal when closed.

8. The thermal processing chamber of claim 7 closely coupled to a heater section coupled to the convection gas inlet, and a temperature measurement sensor coupled to the convection gas outlet.

9. The integrated chamber and heater module of claim 8 coupled to a temperature controller that is programmable for multiple temperature steps from a remote system controller.

10. The integrated chamber, heater controller module of claim 9 coupled to a heat exchanger that cross-couples the inlet and outlet convection gas streams.

11. The integrated chamber, heater, controller, heat-exchanger module of claim 4 coupled to a variable speed fan and filter.

12. The integrated chamber, heater, controller, heat exchanger, fan-filter module of claim 11 mounted into a frame module with supports for all components, and all connections organized into a modular interconnect panel, thereby forming an integrated process module.

13. A wafer processing system comprised of one or more integrated process modules of claim 12 integrated with a robotic wafer handler and a wafer loading port where the port is a pass-thru shelf or a removable cassette with single or multiple wafer positions.

14. A wafer processing system comprised of one or more integrated process modules of claim 6 integrated with a robotic wafer handler and a wafer loading port where the port is a SMIF-type load port; the load port may include a product lot-tracking feature.

15. A wafer processing system comprised of one or more integrated process modules of claim 14 integrated with a robotic wafer handler and a wafer loading port where the port is a FOUP-type load port; the load port may include a product lot-tracking feature.

16. A wafer processing system as identified in claim 15 but including a feature to read identification codes of individual wafers.

17. The wafer processing system as identified in claim 16 closely coupled to a second wafer processing system that applies photo-resist, solder-paste, solder-balls, dielectric, or other coatings or stenciled substances which require a subsequent thermal process step to either cure, stabilize, reflow, or otherwise drive the process to a stable condition.

* * * * *